United States Patent
Kanner et al.

(10) Patent No.: US 11,804,693 B2
(45) Date of Patent: Oct. 31, 2023

(54) METHOD AND DEVICE FOR ULTRAVIOLET TO LONG WAVE INFRARED MULTIBAND SEMICONDUCTING SINGLE EMITTER

(71) Applicant: Northrop Grumman Systems Corporation, Falls Church, VA (US)

(72) Inventors: Gary S. Kanner, Algonquin, IL (US); Maurice Leroy Strong, III, Prospect Heights, IL (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 24 days.

(21) Appl. No.: 16/823,157

(22) Filed: Mar. 18, 2020

(65) Prior Publication Data
US 2021/0296854 A1   Sep. 23, 2021

(51) Int. Cl.
*H01S 5/062* (2006.01)
*H01S 5/042* (2006.01)
(Continued)

(52) U.S. Cl.
CPC ............ *H01S 5/0427* (2013.01); *H01S 5/028* (2013.01); *H01S 5/0425* (2013.01);
(Continued)

(58) Field of Classification Search
CPC ............ H01S 5/06203; H01S 5/06206; H01S 5/3401; H01S 5/3402; H01S 5/3418; H01S 5/3419; H01S 5/0287
See application file for complete search history.

(56) References Cited

U.S. PATENT DOCUMENTS

| 6,016,214 A | 1/2000 | Meyer, Jr. |
| 6,101,023 A | 8/2000 | Meyer, Jr. |

(Continued)

FOREIGN PATENT DOCUMENTS

EP   0297654 A1 *  4/1989

OTHER PUBLICATIONS

Hibberd, M.T., "Dielectric response of wurtzite gallium nitride in the terahertz frequency range," Solid State Communications, 247 (68-71), Aug. 21, 2016, (4 pages.).
(Continued)

*Primary Examiner* — Tod T Van Roy
(74) *Attorney, Agent, or Firm* — Dority & Manning, P.A.

(57) ABSTRACT

A method for generating light emission is provided. The method includes providing a transistor element including collector, emitter, and base regions, a quantum cascade region between the base and collector regions, and quantum well structures for interband emission within the base or emitter regions. A waveband controller applies, via first and second electrodes with respect to the collector and base regions, a first electrical signal to control a base-collector junction bias level and select between first and second base-collector bias levels. Selection of the first base-collector bias level causes at least one of the emitter and base regions to produce interband-based light emission having a first wavelength of a first wavelength band. Selection of the second base-collector bias level causes the quantum cascade region to produce intraband-based light emission having a second wavelength of a second wavelength band.

19 Claims, 15 Drawing Sheets

(51) Int. Cl.
*H01S 5/34* (2006.01)
*H01S 5/028* (2006.01)
*H01S 5/343* (2006.01)
*H01S 5/10* (2021.01)
*H01S 5/068* (2006.01)

(52) U.S. Cl.
CPC ...... *H01S 5/06206* (2013.01); *H01S 5/06804* (2013.01); *H01S 5/1096* (2013.01); *H01S 5/3402* (2013.01); *H01S 5/34333* (2013.01); *H01S 5/34346* (2013.01); *H01S 5/0287* (2013.01); *H01S 2302/02* (2013.01)

(56) References Cited

U.S. PATENT DOCUMENTS

| | | | |
|---|---|---|---|
| 6,167,067 A | 12/2000 | Meyer, Jr. | |
| 7,091,082 B2 * | 8/2006 | Feng | H01L 33/0016 257/E33.047 |
| 7,286,583 B2 * | 10/2007 | Feng | B82Y 20/00 372/30 |
| 7,535,034 B2 * | 5/2009 | Walter | H01L 33/04 257/13 |
| 7,693,195 B2 * | 4/2010 | Feng | B82Y 20/00 372/30 |
| 8,948,226 B2 | 2/2015 | Dallesasse | |
| 9,531,156 B2 * | 12/2016 | Hoffman | A61B 1/0661 |
| 9,912,119 B2 * | 3/2018 | Ito | H01S 5/3402 |
| 9,917,418 B2 | 3/2018 | Razeghi | |
| 9,941,665 B1 | 4/2018 | Raring | |
| 10,033,160 B2 | 7/2018 | Yang | |
| 10,038,306 B2 | 7/2018 | Kotani | |
| 2009/0180501 A1 * | 7/2009 | Barlow | H01S 5/06256 372/32 |
| 2014/0050241 A1 * | 2/2014 | Dallesasse | H01S 5/3401 372/45.01 |
| 2015/0311665 A1 * | 10/2015 | Belkin | G02F 1/365 372/20 |
| 2016/0064901 A1 | 3/2016 | Terashima | |
| 2017/0079102 A1 * | 3/2017 | Simin | H01L 33/38 |
| 2018/0083421 A1 | 3/2018 | Audet | |
| 2018/0166854 A1 | 6/2018 | Dadgar | |

OTHER PUBLICATIONS

Dallesasse, John M., "Progress on the transistor-injected quantum-cascade laser," Proceedings of SPIE 10540, Quantum Sensing and Nano Electronics and Photonics XV 105401P, San Francisco, California, Jan. 26, 2018, (11 pages.).

Sangil, Ahn, "Enhanced light output power of quantum cascade lasers from a tilted front facet," Optical Society of America, 2013, (9 pages.).

Fenner, D.B., "Antireflection Coating for External-Cavity Quantum Cascade Laser Near 5 THz," Materials Research Society, Apr. 2007, (4 pages.).

Rajab, Khalid Z., "Broadband Dielectric Characterization of Aluminum Oxide (Al2O3)," J. Micro. and Elect. Pack. 5, 101-106, 2008 (7 pages.).

Wang, Ke, "Controlling loss of waveguides for potential GaN terahertz quantum cascade lasers by tuning the plasma frequency of doped layers," RIKEN Center for Advanced Photonics (RAP), Sendai 980-0845, Japan, Jul. 24, 2018, (6 pages.).

Hensley, J.M., "Demonstration of an External Cavity Terahertz Quantum Cascade Laser," Optical Society of America, 2005, (4 pages.).

Liu, H.C., "How good is the polarization selection rule for intersubband transitions?" Applied Physics Letters 72 (1682), 1998, (4 pages.).

Kitamura, Rei, "Optical constants of silica glass from extreme ultraviolet to far infrared at near room temperature," Applied Optics, vol. 46, No. 33, Nov. 20, 2007 (16 pages.).

Moustakas, Theodore D., "Optoelectronic device physics and technology of nitride semiconductors from the UV to the terahertz," Reports on Progress in Physics, 80 (106501), Sep. 1, 2017, (42 pages).

Chen, Kanuo, "Quantum structures for recombination control in the lightemitting transistor," Proceedings of SPIE 10123, Novel In-Plane Semiconductor Lasers XVI, 1012318, San Francisco, California, Feb. 20, 2017, (8 pages.).

Hirayama, H., "Recent progress and future prospects of THz quantum-cascade lasers," Proceedings of SPIE 9382, Novel In-Plane Semiconductor Lasers XIV, 938217, San Francisco, California, Mar. 10, 2015, (12 pages.).

Gmachl, Claire, "Recent progress in quantum cascade lasers and applications," Reports on Progress in Physics, 64 (1533-1601), Oct. 25, 2001, (70 pages.).

Holonyak Jr., Nick, "Ultrafast Transistors That Output Optical and Electrical Signals Open New Computing Frontier," IEEE Spectrum, 2006, (6 pages.).

Yamashita, Yoji, "A 340-nm-band ultraviolet laser diode composed of GaN well layers," Optics Express 3133, vol. 21, No. 3, Feb. 11, 2013, (5 pages.).

Chen, Kanuo, "Design and Modeling of Mid-Infrared Transistor-Injected Quantum Cascade Lasers," CS MANTECH Conference, May 19-22, 2014, Denver, Colorado, (4 pages.).

Paiella, Roberto, "High-frequency modulation without the relaxation oscillation resonance in quantum cascade lasers," American Institute of Physics, Appl. Phys. Lett. 79, (2526), 2001, (4 pages.).

Ahi, Kiarash, "Review of GaN-based devices for terahertz operation," Optical Engineering 56(9) 09090, 2017, (15 pages.).

Z. Lin, et al., "Modeling of the Electrically-Tunable Transistor-Injected Quantum Cascade Laser", Journal of Applied Physics 122.23 (2017): 235701, 22 pages.

A. S. Barker Jr. et al., "Infrared Lattice Vibrations and Free-Election Dispersion in GaN", Physical Review B, vol. 7, No. 2, Jan. 15, 1973, 8 pages.

I. H. Malitson, "Interspecimen Comparison of the Refractive Index of Fused Silica", Journal of the Optical Society of America, vol. 55, No. 10, Oct. 1965, 5 pages.

Rémi Boidin, et al., "Pulsed laser deposited alumina thin films", Ceramics International 42 (2016) 1177-1182, Sep. 15, 2015, 6 pages.

O.S. Heavens, "Optical Properties of Thin Solid Films", Dover Publications, Inc, New York, 1991, 5 pages.

Max Born & Emil Wolf, "Principles of Optics", Electromagnetic Theory of Propagation Interference and Diffraction of Light, Sixth Edition, Pergamon Press, New York, Sixth Ed., 1980, 4 pages.

H. Angus Macleod, "Thin Film Optical Filters", CRC Press, Boca Raton, FL, 4th ed., 2010, 96 pages.

Mliton Feng, et al., "The Transistor Laser: A Natural for Optoelectronic Integrated Circuits", https://www.photonics.com/Article.aspx?AID=26091, Features, Photonics Spectra, Jul. 2006, 7 pages.

B.E.A. Saleh & M.C. Teich, Fundamentals of Photonics Wiley, New Jersey, Second Edition, 2007, 6 pages.

* cited by examiner

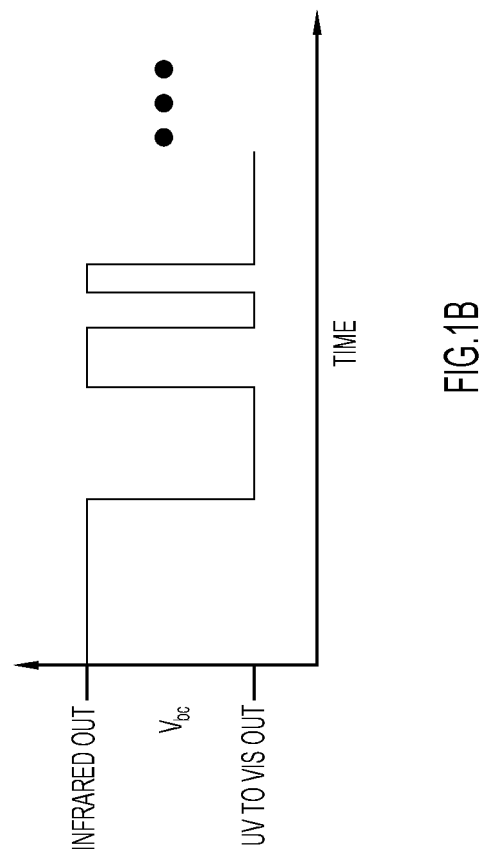
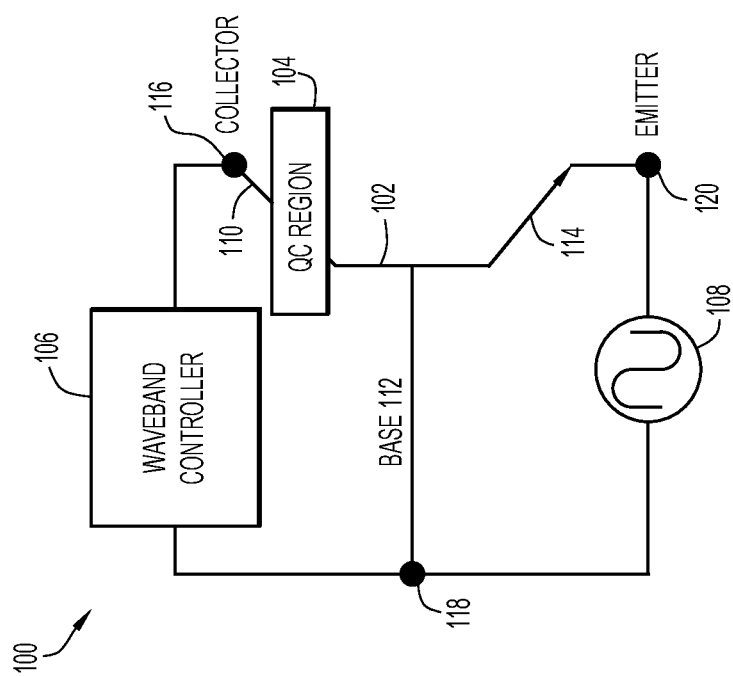

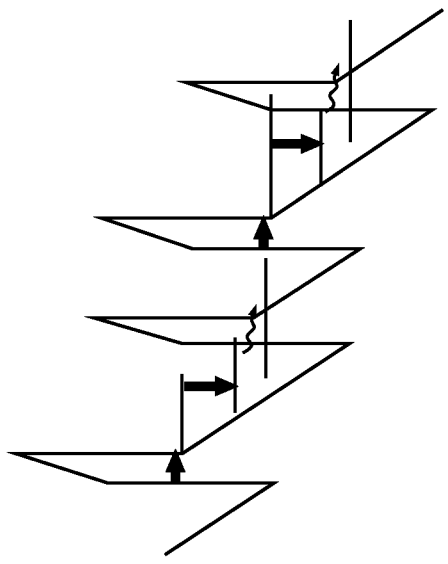
FIG. 7A
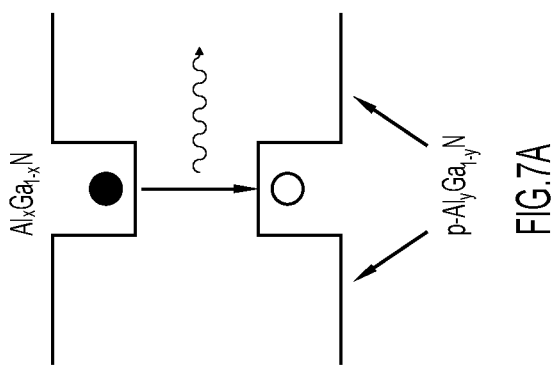
FIG. 7B
| QC WELL/BARRIER MATERIAL | SUBSTRATE | INTERBAND | INTRABAND |
|---|---|---|---|
| GaN/AlGaN | GaN, AlN, Sapphire, SiC, or Si | UV-VIS | THz |
| InGaAs/InAlAs | InP | NIR-SWIR | MWIR-THz |
| GaAs/AlGaAs | GaAs | NIR | MWIR-THz |
FIG. 8

| MATERIAL | WAVELENGTH (μm) | REFRACTIVE INDEX |
|---|---|---|
| GaN | 0.36 | 2.5 |
| GaN | 300 | 3.1 |
| SiO$_2$ | 0.36 | 1.475 |
| SiO$_2$ | 300 | 2.09 |
| Al$_2$O$_3$ | 0.36 | 1.65 |
| Al$_2$O$_3$ | 300 | 3.07 |

METHOD AND DEVICE FOR ULTRAVIOLET TO LONG WAVE INFRARED MULTIBAND SEMICONDUCTING SINGLE EMITTER

TECHNICAL FIELD

The present disclosure relates generally to semiconductor light emitting devices and methods.

BACKGROUND

In conventional two-terminal quantum cascade lasers (QCLs), a change in drive current also changes the device bias due to the intrinsic relationship between current and electric field across the cascade region. In such QCLs, a changing bias causes the wavelength to shift because the electronic transition energy is dictated by the associated field $\varepsilon$ across the potential wells. The bias dictates the slope of the field defining the quantum "staircase." Higher drive current, for example, maps onto higher bias and a steeper field across the cascade. This tends to increase photon transition energy, which shortens its wavelength (blueshift).

On the other hand, transistor-injected QCLs (TI-QCLs) are three-terminal devices that, unlike conventional two-terminal QCLs, provide a degree of freedom that allows for independent control of drive current and field, and therefore optical power and wavelength. Conventional TI-QCLs, however, have been limited in the ranges of wavelengths at which light (laser) emission can be achieved.

SUMMARY

In accordance with a first aspect, a method for generating light emission is provided. The method includes providing a transistor element including a collector region, an emitter region, and a base region. The method includes providing a first electrode, a second electrode, and a third electrode. The first electrode is coupled to the collector region, the second electrode is coupled to the base region, and the third electrode is coupled to the emitter region. The method includes providing a quantum cascade region between the base and collector regions of the transistor element and quantum well structures for interband emission within the base or emitter regions. The method includes applying, by a waveband controller via the first and second electrodes with respect to the collector and base regions, a first electrical signal to control a base-collector junction bias level and select between first and second base-collector bias levels, wherein selection of the first base-collector bias level causes at least one of the emitter region and the base region to produce interband-based light emission having a first wavelength of a first wavelength band, wherein selection of the second base-collector bias level causes the quantum cascade region to produce intraband-based light emission having a second wavelength of a second wavelength band.

In accordance with a second aspect, a semiconductor light-emitting device is provided. The semiconductor light-emitting device includes a transistor element including a collector region, an emitter region, and a base region. Coupled to the collector region is a first electrode, coupled to the base region is a second electrode, and coupled to the emitter region is a third electrode. A quantum cascade region is disposed between the base and collector regions of the transistor element. A waveband controller is connected to the first and second electrodes and configured to apply a first electrical signal via the first and second electrodes with respect to the collector and base regions to control a base-collector junction bias level and select between first and second base-collector bias levels, wherein selection of the first base-collector bias level causes at least one of the emitter region and the base region to produce interband-based light emission having a first wavelength of a first wavelength band, wherein selection of the second base-collector bias level causes the quantum cascade region to produce intraband-based light emission having a second wavelength of a second wavelength band.

BRIEF DESCRIPTION OF THE DRAWINGS

Example embodiments of the invention are described herein with reference to the accompanying drawing figures, in which like reference numerals in the various figures are utilized to designate like components, and in which:

FIG. 1A is a high-level block diagram of a semiconductor light-emitting device, according to an example embodiment.

FIG. 1B is a chart of voltage over time for a base collector voltage of a semiconductor light-emitting device, according to an example embodiment.

FIGS. 7A and 7B show schematic energy diagrams to represent interband and intraband components for an example TI-QCL.

FIG. 8 shows a table of various materials and example possible pairs of intraband and interband emissions.

DESCRIPTION OF EXAMPLE EMBODIMENTS

Figure 2:
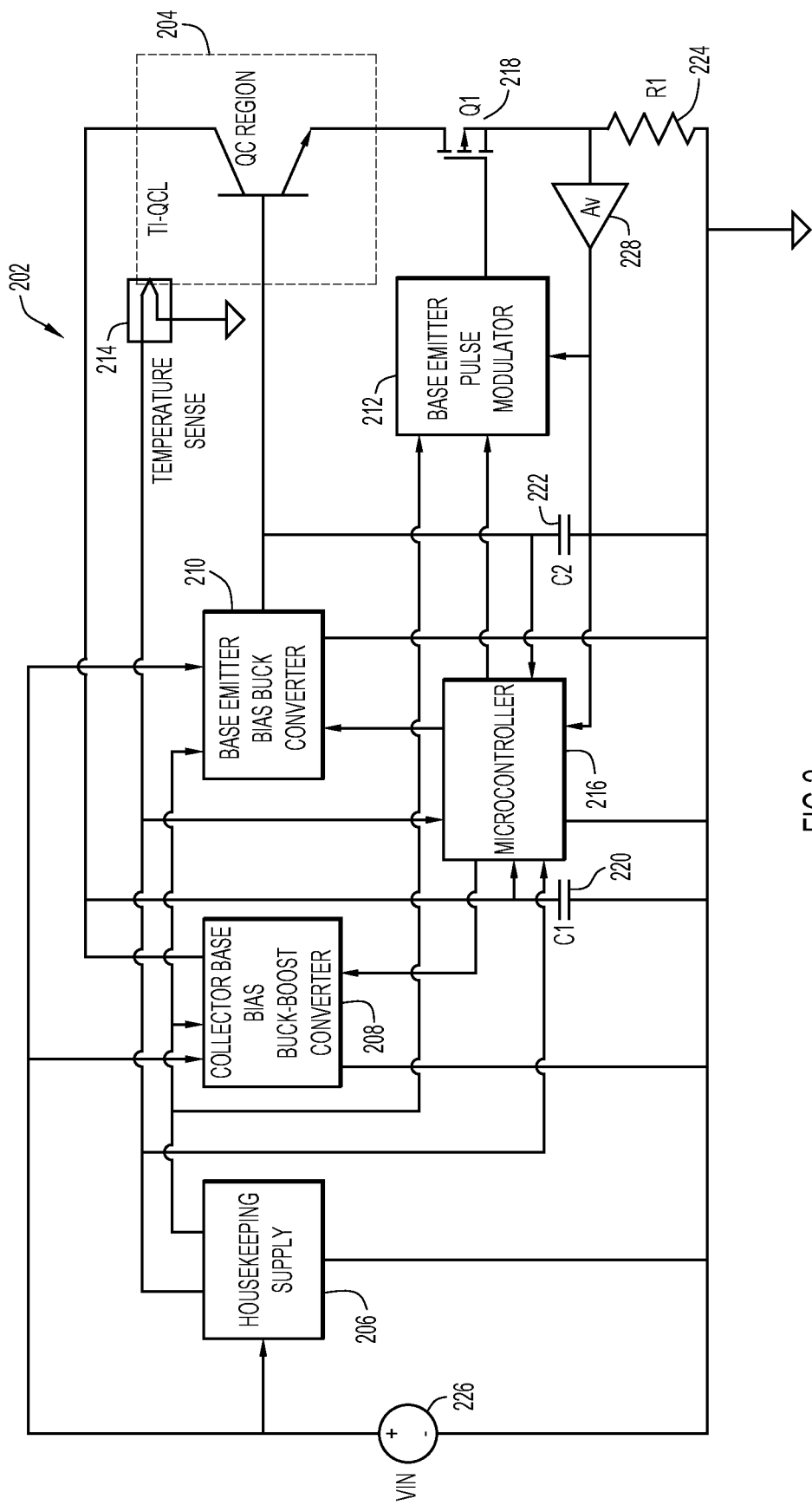
FIG. 2 is a block diagram of an example implementation of the semiconductor light-emitting device of FIG. 1A.

A transistor-injected quantum cascade laser (TI-QCL) may incorporate a QCL into a base-collector junction of a heterojunction bipolar transistor (HBT). A bias across the base-collector junction of the TI-QCL controls a wavelength of emitted light. The TI-QCL may maintain a constant field or wavelength through a fixed base-collector bias. If a drive current is to be changed, it can be controlled through the base-emitter junction, providing independent control of power and wavelength. When the base-collector bias is not optimized for intrasubband resonance yielding infrared output, an interband recombination of electrons and holes may occur in the base or emitter region instead. In GaAs QCLs, this leads to emission in the near infrared (NIR) at around 880 nm. If only mid- or long-wave (MWIR or LWIR) emission were desired, emission in the NIR would be an undesirable consequence. However, applications have been identified where it may be desirable to produce MWIR or LWIR as well as a shorter wavelength band in a sequential fashion. The interband emission may be at wavelengths as short as deep ultraviolet and as long as far infrared if GaN/AlGaN or AlN/GaN quantum wells/barriers are used in the active layers grown on GaN or AlN substrates.

A TI-QCL has a third terminal and has the equivalent circuit model of an NPN transistor. The characteristics of this three-terminal device are that the spectral line output is a function of the collector-base junction voltage ($V_{CB}$) bias and the optical output power is a function of the base-emitter junction voltage ($V_{BE}$) bias. Varying the $V_{CB}$ bias produces multiple spectral lines from a single device. Temporally modulated multispectral output can be achieved with one $V_{CB}$ bias circuit and one $V_{BE}$ bias circuit, or, in other words, a single modulation circuit.

The present disclosure is directed to semiconductor light emitting devices and methods for generating light emission. Embodiments described herein represent improvements over conventional TI-QCLs. Embodiments described herein include a single laser source that is capable of emitting light from a single aperture at wavelengths as short as ultraviolet and as long as long wave infrared, even terahertz (THz). Selection of a wavelength band of emitted light is controlled through a base-collector junction of a TI-QCL. Each wavelength band can be independently modulated through an electrical signal applied to the emitter-base junction of the TI-QCL. Relative to laser systems incorporating discrete sources for each spectral band, a single multispectral source with a single aperture for the multiple emission wavelengths eliminates or reduces pointing errors between the bands. Because the different wavebands occur for different base-collector biases, the wavebands can be independently optimized with independent waveforms defined by a modulated signal at the base-emitter terminal.

Embodiments described herein enable real time or near real time selection of spectral lines. Embodiments may employ temperature sensing feedback to ensure accuracy of the spectral lines. Embodiments may provide mechanisms for varying temporal modulation parameters (e.g., amplitude, pulse width, and pulse repetition rate). Embodiments may employ external optical cavity architectures for providing stimulated emission through a single aperture. For example, cleaved facets and external optical element configurations are provided for enhancing stimulated emission in multiple wavebands through a single aperture.

Embodiments described herein utilize materials, such as, for example, GaN and AlN, to enable infrared emission through intraband transitions and to enable ultraviolet (UV) to visible emission through an interband process. The presence of different wavebands is controlled by adjusting a base-collector voltage to align or mis-align upper and lower quantum states within the electron conduction band. In other words, a particular bias across the base-collector junction may be applied such that in the former case the upper and lower quantum states of the active region are in resonance, and in the latter they are misaligned. The same semiconducting chip is the source of emission in the different bands. It draws less power since the energy consumed is a one-step process of electrical-to-optical energy transfer, with a single power supply and heat sink. Prior techniques and devices introduce additional steps that include optical-to-optical energy transfer and/or less efficient nonlinear optical processes.

The TI-QCL may emit in at least two widely disparate spectral bands that originate from optical transitions between electronic conduction subbands (intraband component) and from electron-hole recombination within the base or emitter (interband component). Embodiments described herein may enhance stimulated emission from both intraband and interband components within the same laser cavity for a semiconductor light-emitting device having a waveband controller that is biased to produce one or the other spectral band. By applying a bias across the base-collector junction, for intraband-based transitions, the upper and lower quantum states of the active region are in resonance, and for interband-based transitions, they are misaligned.

Embodiments may reduce size, weight, and power consumption (SWaP) and/or cost of systems that use multiple wavelength bands and typically use separate discrete sources for each wavelength band. The laser source (emitter) is typically the most expensive component in a semiconductor laser system/device, so to the extent that two different wavelength bands can be obtained with a single device and emitted through a single aperture, cost may be reduced by, for example, close to a factor of two. With additional spectral lines included, the cost savings generally will increase proportionally. Additionally, the number of electrical drivers and parts associated with thermal management may also be decreased, for example, by that factor. Using nitride materials may help decrease costs associated with thermal management as these materials have high thermal conductivity.

By employing the embodiments described herein, a single TI-QCL device is capable of intraband and interband emissions of multiple wavelength bands spanning a wavelength range of deep UV to THz. The base-collector and base-emitter bias levels can be adjusted to independently optimize one or the other. By replacing conventional QCL materials with GaN/AlGaN or AlN/GaN quantum wells/barriers, the emission bands can span the deep UV to far infrared (FIR). Prior techniques do not yield emission bands over such disparate spectral regions while also confining SWaP to characteristics of or similar to a single QCL. Additionally, the output would come through the same aperture and eliminate any boresight issues among different wave bands that occur when using spatially separated emitters.

Demand exists for devices and methods that allow for an increased number of wave bands than conventional devices and methods with little or no relaxation of SWaP. Adding sources adds volume, weight, power draw, cost and introduces risk of pointing errors if each band is associated with a separate discrete source. Parametric processes in known single crystals of nonlinear optical sources are not able to produce multiple bands across such wide (i.e., UV to FIR) wavelength ranges, and the process is less efficient compared to the direct diode approach of TI-QCLs. Similarly, second harmonic and difference frequency generation in QCLs are also inefficient processes, particularly as a result of being restricted to continuous wave (CW) operation, and these processes are also not be capable of yielding wavelengths shorter than about 2 µm. Wavelength conversion in laser cavities over a broad range is typically limited by low efficiency of parametric processes, ability to obtain complex mirror coatings, and the size of resonators required to get eigenmodes supporting sufficiently narrow beam waists for efficient conversion. Also laser cavities that simultaneously resonate multiple wavelengths are unstable unless active stabilization techniques are employed that further add SWaP. On the other hand, utilizing both the intraband and interband emissions from a TI-QCL would use less SWaP due to the small size of chips that may be employed and the high efficiency of the direct diode process.

FIG. 1A is a high-level block diagram of a semiconductor light-emitting device 100, according to an example embodiment. The semiconductor light-emitting device 100 includes a transistor element 102, a quantum cascade (QC) region 104, a waveband controller 106, and a modulator 108.

The semiconductor light-emitting device 100 may be made, for example, using any suitable techniques conventionally used to fabricate heterojunction bipolar transistors (HBTs) and QCLs.

The transistor element 102 may include a collector region 110, a base region 112, and an emitter region 114. In an example embodiment, the transistor element 102 is an NPN HBT. For example, the collector region 110 may be an n-type collector, the base region 112 may be a p-type base, and the emitter region 114 may be an n-type emitter.

The QC region 104 may be integrated with the transistor element 102. For example, the QC region 104 may be disposed between the base region 112 and the collector region 110. The QC region 104 may include a well region including gallium and nitrogen and a barrier region including aluminum, gallium, and nitrogen. For example, the well region may include gallium nitride (GaN) and the barrier region may include aluminum gallium nitride (AlGaN). As another example, the QC region 104 may include a well region comprising aluminum nitride (AlN) and a barrier region comprising gallium nitride (GaN).

A first electrode 116 may be coupled to the collector region 110. A second electrode 118 may be coupled to the base region 112. A third electrode 120 may be coupled to the emitter region 114.

The waveband controller 106 may be connected to the first electrode 116 and the second electrode 118. The waveband controller 106 may be configured to apply a first electrical signal via the first and second electrodes 116, 118 to control a base-collector junction bias level and select between first and second base-collector bias levels. Selection of the first base-collector bias level causes at least one of the base region 112 and the emitter region 114 to produce interband-based light emission having a first wavelength of a first wavelength band. For example, the waveband controller 106 may apply, via the first and second electrodes 116, 118, a first electrical signal so that the bias of the base-collector junction is a first base-collector bias level at which light is caused to be emitted at a first wavelength of a first wavelength band. Selection of the second base-collector bias level causes the QC region to produce intraband-based light emission having a second wavelength of a second wavelength band. For example, the waveband controller 106 may apply, via the first and second electrodes 116, 118, a second electrical signal so that the bias of the base-collector junction is a second base-collector bias level at which light is caused to be emitted at a second wavelength of a second wavelength band.

In an example embodiment, the waveband controller 106 is configured to adjust the first electrical signal from the first base-collector bias level to the second base-collector bias level in order to switch from emission of the interband-based light emission having the first wavelength to the intraband-based light emission having the second wavelength, and adjust the first electrical signal from the second base-collector bias level to the first base-collector bias level to switch emission from the intraband-based light emission having the second wavelength to the interband-based light emission having the first wavelength. Each of the intraband-based light emission and the interband-based light-emission is emitted from a single emission aperture for a TI-QCL chip that includes a highly reflecting mirror for both wavebands.

The first wavelength band may include at least one of UV radiation and visible light wavelengths, and the second wavelength band may include at least one of MWIR radiation and THz radiation wavelengths. FIG. 1B is a chart of voltage over time for a collector-base junction voltage of a semiconductor light-emitting device, according to an example embodiment. As shown in FIG. 1B, particular bias levels of the collector-base junction may correspond to different output wavelengths of emitted light.

In an example embodiment, the waveband controller 106 includes a microcontroller and power converter circuitry, described in more detail below with respect to FIGS. 3-6. The microcontroller is, for example, communicatively coupled to the power converter circuitry to control the base-collector junction bias.

The modulator 108 may be connected to the second and third electrodes 118, 120 and configured to apply a second electrical signal via the second and third electrodes 118, 120 with respect to the base and emitter regions 112, 114, to modulate an optical power, pulse width, pulse repetition frequency, and/or pulse shape of the intraband-based light emission from the quantum cascade region 104 and/or the interband-based light emission from the at least one of the emitter region 118 and the base region 120. For example, the modulator 108 may apply, via the second and third electrodes 118, 120, a second electrical signal to control a base-emitter junction bias level to produce a modulation waveform that can vary the amplitude, pulse width, and/or repetition frequency of the interband and/or intraband light emission.

In an example embodiment, the semiconductor light-emitting device 100 may include a temperature sensor configured to collect semiconductor light-emitting device temperature data. In such an example embodiment, the waveband controller 106 may be configured to adjust the first electrical signal based on the semiconductor light-emitting device temperature data to maintain emission of at least one of the intraband-based light emission having the first wavelength and the interband-based light emission having the second wavelength at the respective wavelength. Some example semiconductor materials and their respective wavelength temperature coefficients (nm/° C.) have been found to be: GaN, 0.06; GaAs, 0.3; and InP, 0.48.

FIG. 2 is a block diagram of an example implementation of the semiconductor light-emitting device 100 of FIG. 1. In FIG. 2, the multispectral bias and modulation circuitry 202 represents an example implementation of the waveband controller 106 and the modulator 108 of FIG. 1. TI-QCL 204 represents an example of the transmitter element 102 and the QC region 104 of FIG. 1.

Multispectral bias and modulation circuitry 202 is shown as including, in part, a housekeeping supply 206, a collector-base bias circuit 208, a base-emitter bias circuit 210, a base-emitter modulation circuit 212, a temperature feedback circuit 214, and a microcontroller 216. The multispectral bias and modulation circuitry 202 is also shown as including transistor 218, capacitors 220 and 222, resistor 224, voltage source 226, and amplifier 228.

The microcontroller 216 may be used to control each of the housekeeping supply 206, the collector-base bias circuit 208, the base-emitter bias circuit 210, the base-emitter modulation circuit 212, the temperature feedback circuit 214, and the TI-QCL 204. The microcontroller 216 may implement a control scheme including a number of control loops. For example, there may be five control loops: a housekeeping supply loop, a $V_{CB}$ bias loop, a $V_{BE}$ bias loop, a pulse modulator loop, and a temperature sense loop. The function of the microcontroller 216 may be, for example, to: set the output voltages of the $V_{CB}$ and $V_{BE}$ power converters 208, 210; set the current amplitude and pulse width of the base-emitter pulse modulator 212; and tune the $V_{CB}$ bias supply to maintain a desired spectral output in the presence of temperature variations. For example, the microcontroller 216 may receive a temperature feedback signal, as sensed by temperature sense circuit 214, to perform fine tune adjustments to the TI-QCL $V_{CB}$ bias supply. An example algorithm that may be used by the microcontroller 216 to adjust the $V_{CB}$ bias point with respect to the circuit shown in FIG. 2 is $V_{CB}=V_{C1}-V_{C2}$. In this example algorithm, $V_{C1}$ and $V_{C2}$ are the respective voltages across capacitors C1 220 and C2 222. By utilizing this algorithm, the two bias power conversion circuits are able to be single-ended and referenced to the same return, thereby reducing circuit complexity. The desired $V_{CB}$ bias point is selected based upon the chosen spectral line desired at the output and the existing operating temperature of the TI-QCL.

In the example of FIG. 2, the microcontroller 216 sends a signal to the base-emitter pulse modulator 212 so that the base-emitter pulse modulator 212 sends a voltage command to the gate of the transistor Q1 218. The transistor Q1 218 may be a high gain power switch. The voltage command turns on the transistor Q1 218, and current flows through the resistor R1 224 (e.g., 5-10 mΩ), which generates a small voltage. The small voltage that is generated is sent to the amplifier 228 and amplified. The voltage from the amplifier 228 is sent to the microcontroller 216 and the base-emitter pulse modulator 212. The microcontroller 216 is able to determine if the voltage from the amplifier 228 is appropriate (e.g., is not too high or too low from a desired or expected voltage). If the microcontroller 216 determines that the voltage is not appropriate (e.g., is too high or too low), then the microcontroller 216 can send a signal to the base-emitter bias circuit 210 to adjust the bias voltage so that the appropriate current is output from the TI-QCL 204. The microcontroller 216 can send a signal to the collector-base bias circuit 208 to select a spectral line. In other words, the microcontroller 216 can send the signal to cause the collector-base bias circuit 208 to change the voltage bias across the base-collector junction of the TI-QCL 204 to a level that causes emission of the desired spectral line.

Figure 3:
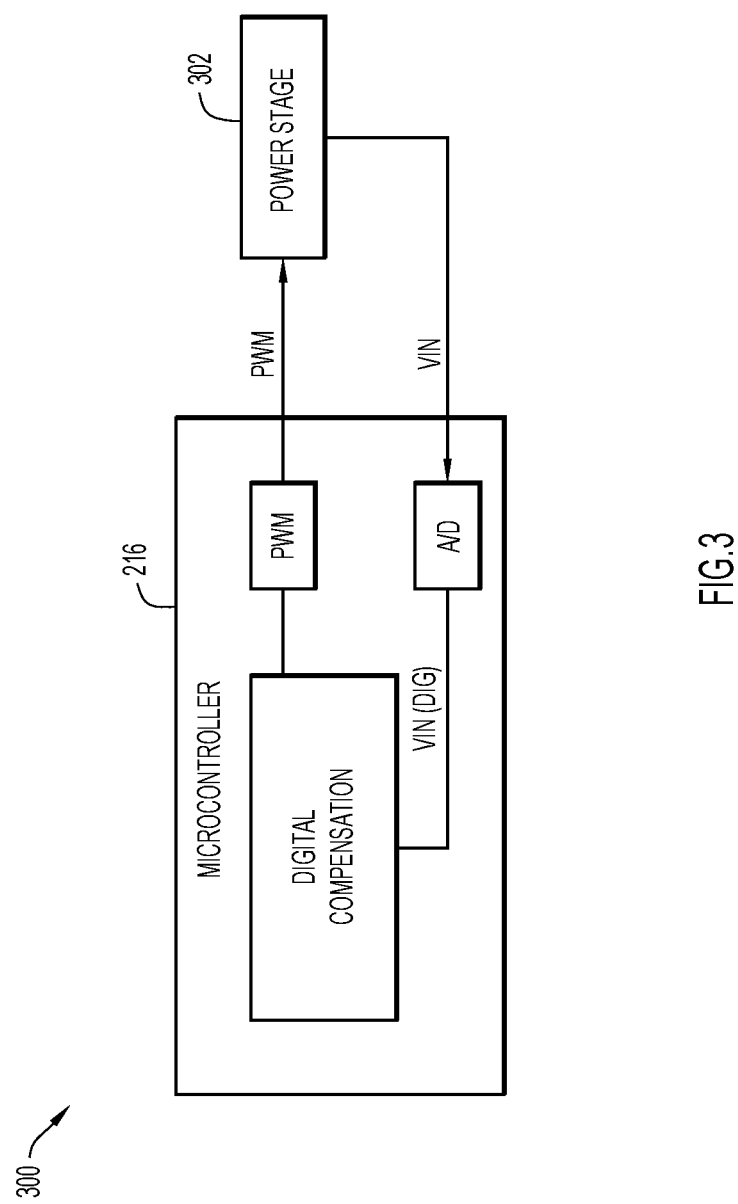
FIG. 3 is a block diagram of a digitally controlled power converter and/or current pulse modulator for a semiconductor light-emitting device, according to an example embodiment.

FIG. 3 is a block diagram of a digitally controlled power converter and/or current pulse modulator 300 for a semiconductor light-emitting device, according to an example embodiment. In the example shown in FIG. 3, the digitally controlled power converter and/or current pulse modulator 300 includes the microcontroller 216 and a power stage 302, which may include the collector-base bias circuit 208 (FIG. 4) and/or the base-emitter bias circuit 210 (FIG. 5). The TI-QCL may incorporate digital control loops to reduce the size, weight and complexity of the control circuitry. In this example implementation, the TI-QCL control scheme is implemented with a Texas Instruments microcontroller, although other microcontrollers could be used to implement the TI-QCL control scheme. There may be five control loops. A Piccolo, Delfino or equivalent microcontroller may be a suitable choice as a single microcontroller that can handle the five control loops in this implementation: Housekeeping Supply, $V_{CB}$ bias, $V_{BE}$ Bias, Pulse Modulator and Temperature Sense. The function of the microcontroller is to set the output voltages of the $V_{CB}$ and $V_{BE}$ power converters, the current amplitude and pulse width of the Base Emitter Pulse Modulator, and receive a temperature feedback signal to perform fine tune adjustments to the TI-QCL $V_{CB}$ bias supply to maintain the desired spectral output over wide temperature variations.

Figure 4:
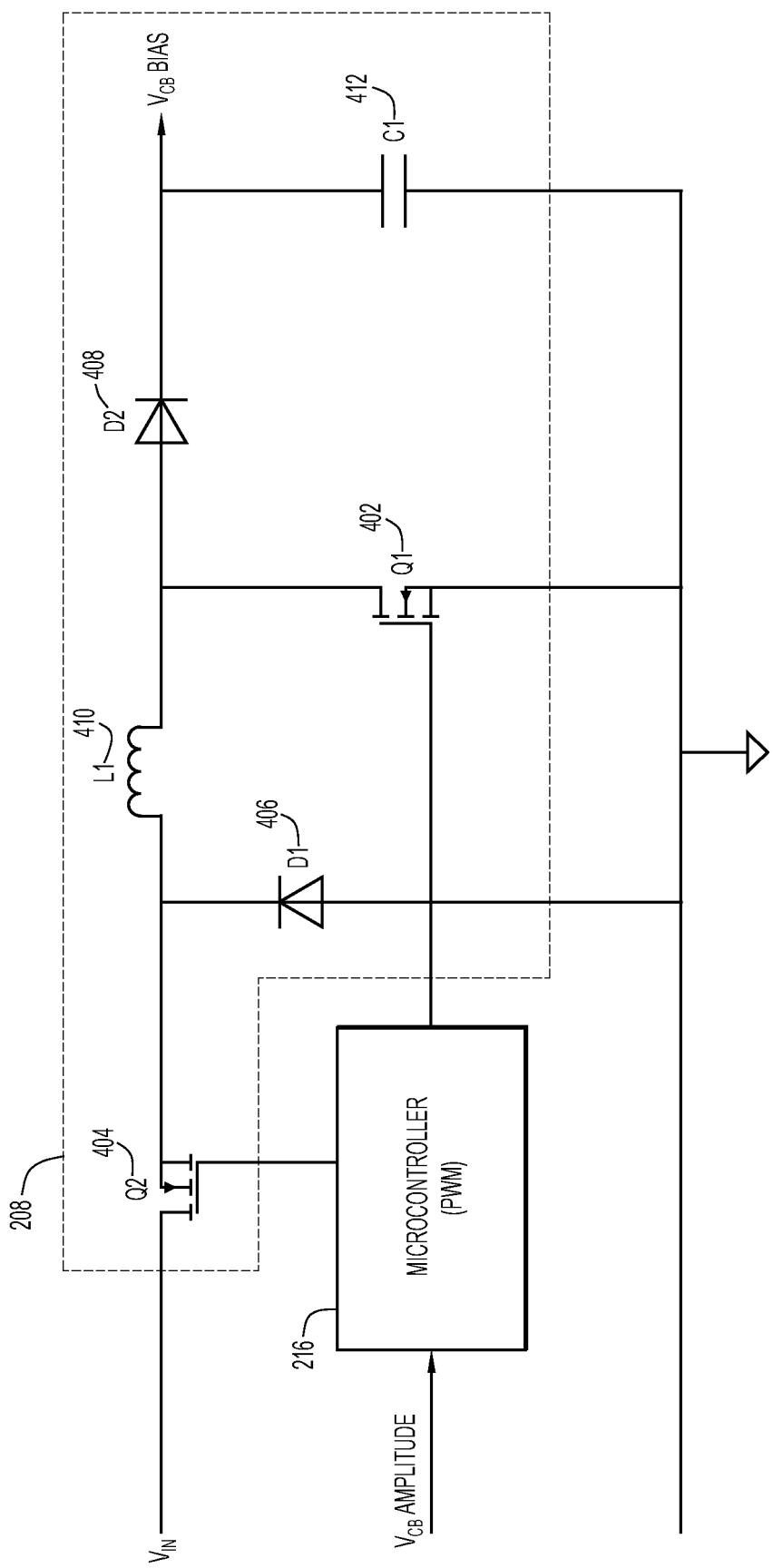
FIG. 4 is a block diagram of an example implementation of a collector-base bias circuit for a semiconductor light-emitting device, according to an example embodiment.
Figure 5:
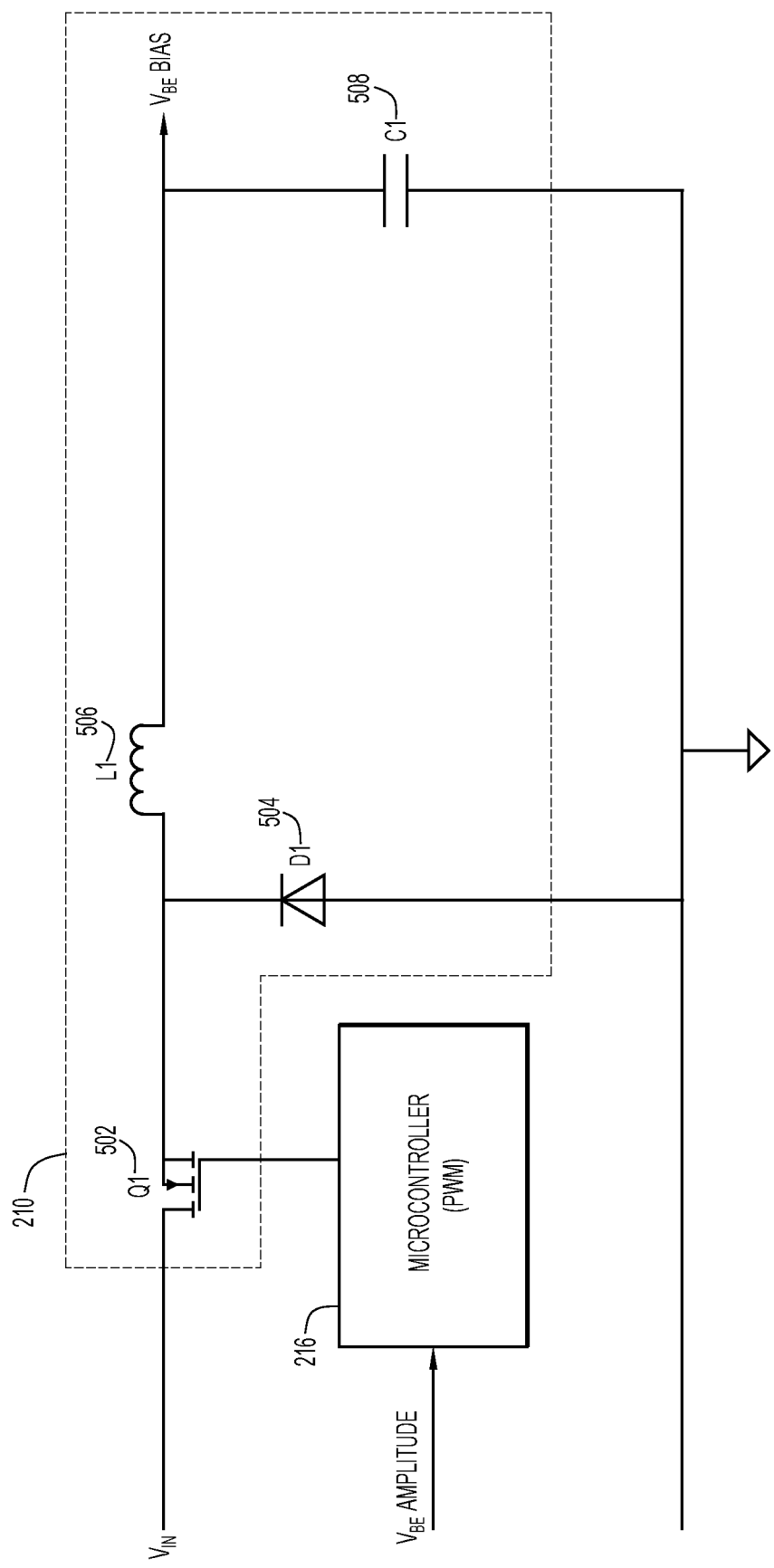
FIG. 5 is a block diagram of an example implementation of a base-emitter bias circuit for a semiconductor light-emitting device, according to an example embodiment.

FIG. 4 is a high-level block diagram of an example implementation of the collector-base bias circuit 208 and the microcontroller 216. In the example implementation shown in FIG. 4, the collector-base bias circuit 208 is a buck-boost converter. The collector-base bias circuit 208 includes transistors Q1 402, Q2 404, diodes D1 406, D2 408, inductor L1 410, and capacitor C1 412. The collector-base bias circuit 208 may be a high power, approximately 100 W buck-boost converter. A buck-boost converter allows the TI-QCL modulator solution to function with an input voltage source that can be higher or lower than the TI-QCL $V_{CB}$ voltage bias requirements. Using digital controllers, the variables for loop closure, including step response and regulation, can be varied in real time. This enables the output bias across the TI-QCL $V_{CB}$ junction to be adjusted in real time based upon the desired spectral line desired from the circuit. Employing digital control also enables the gain-bandwidth-product of the control loop to be adjusted in real time, for example, to minimize the bulk capacitance C1 412 that may be needed to hold the collector node steady during modulation pulses.

FIG. 5 is a block diagram of an example implementation of the base-emitter bias circuit 210 and the microcontroller 216. The base-emitter bias circuit 210 includes transistor Q1 502, diode D1 504, inductor L1 506, and capacitor C1 508. In the example implementation shown in FIG. 5, the base-emitter bias circuit 210 is a low power buck converter. A buck converter is chosen due to the $V_{BE}$ bias voltage typically requiring ≤2V and the input voltage will greater than 2V. By choosing a Buck converter over a Buck-Boost converter, the circuitry used to implement the solution is less complex. FIG. 5 depicts a typical buck converter that will be used to implement the $V_{BE}$ Bias Circuit. By using digital controllers, the variables for loop closure, including step response and regulation can be varied in real time. This enables the output bias across the TI-QCL $V_{BE}$ junction to be adjusted in real time based upon the desired spectral line power output desired from the circuit. Another advantage of digital control is the ability to adjust the gain-bandwidth-product of the control loop in real time to minimize the necessary bulk capacitance C2 to hold the base node steady during modulation pulses.

Figure 6:
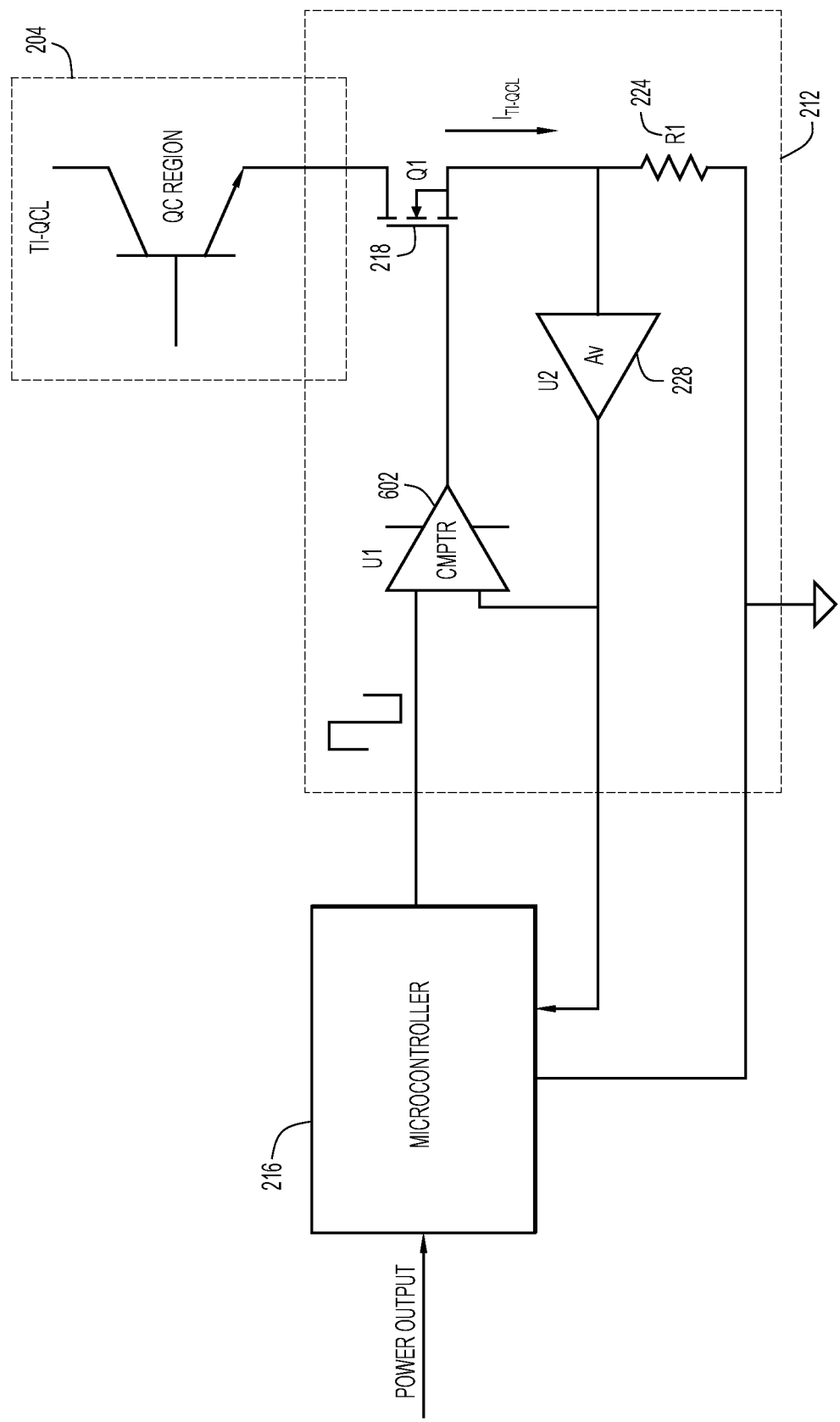
FIG. 6 is a block diagram of an example implementation of a base-emitter modulation circuit for a semiconductor light-emitting device, according to an example embodiment.

FIG. 6 is a block diagram of an example implementation of the base-emitter modulation circuit 212 (also referred to herein as base emitter pulse modulator). The base-emitter modulation circuit 212 may develop the TI-QCL modulation pulse width, amplitude and repetition frequency bias waveforms under the program control of the microcontroller 216. In operation, the microcontroller 216 sends the appropriate waveform to the comparator circuit 602, which develops a voltage pulse to the gate of the transistor (shown as a MOSFET) Q1 218. The current in the transistor Q1 218, which is also the TI-QCL current, increases and is sensed by resistor R1 224. By using a low resistance value of current sense resistor, the amplitude across the resistor may be, for example, tens of millivolts. An amplifier stage (amplifier 228) amplifies the current signal and feeds the signal back to the comparator 602 to regulate the drive voltage to the MOSFET Q1 218. The amplified signal is also sent back to the microcontroller 216 to verify that the correct pulse has been generated in the TI-QCL.

The temperature feedback circuit 214 functions to accurately sense a temperature of the TI-QCL 204 and to feedback the temperature to the microcontroller 216. By doing so, the microcontroller 216 can adjust the $V_{CB}$ bias in order to maintain the proper spectral line output. In other words, based on the temperature sensed by the temperature feedback circuit 214 and provided to the microcontroller 216, the microcontroller 216 can adjust the $V_{CB}$ to maintain a desired spectral line output, which otherwise would deviate from the desired spectral line output. The temperature feedback circuit 214 can be realized in many possible circuit configurations including, but not limited to, for example, a current source feeding a thermistor or precision CMOS, analog temperature sensor, e.g., LMT70 from Texas Instruments. By using this temperature feedback signal in the manner described, spectral line drift due to variations of temperature at the TI-QCL can be eliminated or significantly reduced.

FIGS. 7A and 7B show schematic energy diagrams to represent interband and intraband components, respectively, for an example TI-QCL. The interband (short wavelength) component, originating in the base or emitter layer, is due to electron-hole recombination there, as shown in FIG. 7A, where the solid circle represents an electron and the open circle represents a hole. Converting a device from a low brightness interband source of spontaneous emission, like an LED, to a considerably higher one of stimulated emission—i.e., a laser—is aided by incorporating a single quantum well (SQW) or multiple quantum wells (MQWs) into one of those layers (e.g., the base region 112 or the emitter region 114 of FIG. 1A). One or more SQWs and/or MQWs may be incorporated into base and/or emitter layers. In the example shown in FIG. 7A, the base section contains a narrow SQW designed for UV emission using $Al_xGa_{1-x}N$ embedded in p-doped $Al_yGa_{1-y}N$ with y>x. Near-UV to visible emission can be obtained by utilizing InGaN wells surrounded by GaN. Because of quantum confinement, the SQW compared to bulk recombination enables lower laser threshold current density, higher efficiency, narrower linewidth, faster modulation response and decreased sensitivity to temperature. Output power can be vastly increased by fabricating MQWs to scale up the gain. The radiative transition in FIG. 7A is represented by the downward arrow, whereas it is the diagonal one in FIG. 7B and the corresponding wavelengths $\lambda_{inter}$ and $\lambda_{intra}$ are determined by the energy separations between the upper and lower levels. Intraband (MWIR to THz) emission is shown in FIG. 7B, in which the radiative emission may correspond to a diagonal transition between electronic subbands (thin horizontal lines) in a THz device. The GaN and AlGaN band edges represented here are strongly tilted due to the polarization-induced built-in electric fields. Although FIG. 7B depicts a single stage of the cascade as consisting of two wells, it may contain three or four, and three or four subbands may primarily be involved in the relaxation kinetics. Following the radiative transition, the electrons are injected from the ground state of the previous stage into the next one (horizontal solid arrows) and then relax through longitudinal optical (LO) phonon emission (solid downward) to the upper state; only two stages are shown here, but the TI-QCL device may contain more than 100 or more for THz wavelengths.

Stimulated emission of both interband and intraband components uses feedback from reflective surfaces on both sides of the active region. This may be accomplished by forming cleaved, uncoated facets on these sides such that a Fabry-Perot resonator is formed based on the Fresnel reflections from each end. In general, however, the reflectivities of the facets are not optimized for maximum optical output, and the photons then escape from both sides, whereas it is more desirable to transmit them through only a single facet.

FIG. 8 shows a table of various materials and example possible pairs of intraband and interband emissions for a semiconductor light-emitting device according to example embodiments of the invention. The columns interband and intraband indicate, respectively, the wavelengths $\lambda_{intra}$ and $\lambda_{inter}$ or spectral region that are enabled by waveband control of the three-terminal device that includes a quantum cascade (QC) region. The column identified as QC Well/Barrier Material, indicates the quantum well/barrier combinations that form the QC region. For GaN-based material systems, different types of substrate materials are being evaluated relative to device performance, particularly in the $\lambda_{intra}$ spectral region.

The table of FIG. 8 shows that the GaN system supports the most widely separated wavelength regions for these wavelengths. On the long wavelength side, GaN's very large (e.g., compared to GaAs) longitudinal optical phonon (LO) energy enables continuous wave (CW) THz operation, for example, at room temperature. This is in contrast to GaAs QCLs, which generally must be cooled for THz emission in pulsed mode, and even lower temperature for CW operation.

Figures 9, 10:
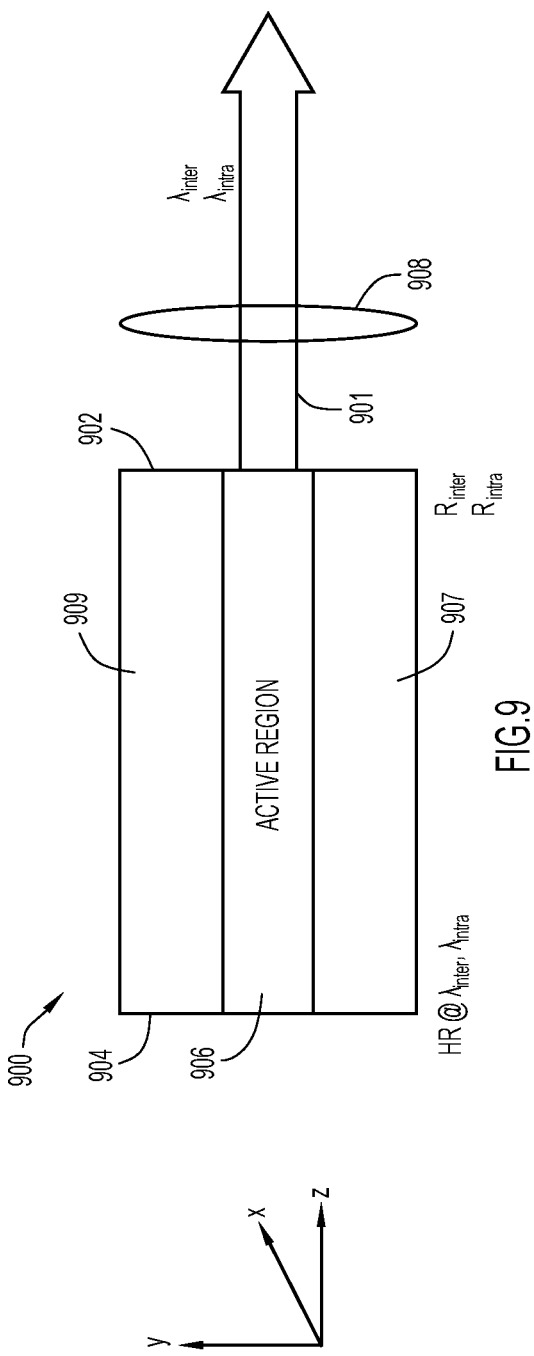
FIG. 9 is a high-level block diagram of a monolithic laser incorporating a TI-QCL chip, according to an example embodiment.
FIG. 10 shows a table of refractive indices versus wavelength for GaN and candidate coating materials for a semiconductor light-emitting device according to an example embodiment.

FIG. 9 is a high-level block diagram of a TI-QCL chip 900 for a semiconductor light-emitting device, according to an example embodiment. The TI-QCL chip 900 has facets 902, 904. In FIG. 9, the facets 902 are shown as the left and right sides of the TI-QCL chip 900, respectively, and an active region is shown surrounded by cladding layers 907 and 909. In FIG. 9, facet 902 represents a front facet and facet 904 represents a rear facet. The facets 902, 904 form the bounds of a waveguide that defines a laser cavity of the TI-QCL chip 900. The facets 902, 904 may be formed by cleaving ends of the TI-QCL chip 900. The front facet 902 may be uncoated and may have Fresnel reflectivities of $R_{inner}$ and $R_{intra}$. In the example shown in FIG. 9, the front facet 902 functions as an output coupler for the photons that are emitted. The rear facet 904 may be high reflector (HR) coated. The active region 906 is where photons are generated and has a gain medium where lasing can occur. The active region 906 contains at least one quantum well to confine interband emission in a base or emitter of the TI-QCL chip 900, and may include multiple stages (e.g., tens of stages) of quantum cascade layers in a base-collector junction of the TI-QCL chip 900. The arrow 901 extending from the active region 906 represents photon emission from the front facet 902. The width of the arrow represents the aperture from which the photons are emitted.

By employing a rear facet that is coated as a high reflector (HR) and a front facet that is uncoated, the laser cavity defined by the waveguide bounded by the facets 902, 904 would have an improved quality factor Q for both interband and intraband wavelengths. Fresnel reflectivities $R_{inter}$ and $R_{intra}$ may be, for example, approximately 18% and 27% respectively for those components in GaN. These values may be based on averages of various indices of refraction at UV and THz wavelengths (FIG. 10).

FIG. 9 also shows a lens 908 for collimating light emitted from the active region 906. In the example shown in FIG. 9, the lens is positioned adjacent to the front facet 902 in order to collimate the emitted beam 901 from the active region 906. The emitted beam naturally diverges rapidly from the small emission aperture. For a GaN system, such a lens could be fabricated from, for example, Polytetrafluoroethylene (PTFE), which has low absorption and relatively flat dispersion across the interband and intraband spectral regions. Consequently, a single lens of this material placed a focal length from the front facet 902 could collimate both beams (inter and intra) with minimal chromatic aberration. Note that FIG. 9 is a very simplified cross-section of a TI-QCL device that does not show the details of the epitaxial layering; a device structure that includes an example of cladding layers that may be employed for waveguiding can be found in John M. Dallesasse, Kanuo Chen, and Fu-Chen Hsiao "Progress on the transistor-injected quantum-cascade laser", Proc. SPIE 10540, Quantum Sensing and Nano Electronics and Photonics XV, 105401P (26 Jan. 2018), the contents of which are herein incorporated by reference.

The laser gain may not be high enough for one or more spectral components to overcome the cavity loss associated with Fresnel reflections at the front facet. In an example, the front facet 902 may be coated to be partially reflecting (PR) with different reflectivities that maximize the output powers in their respective bands. These optimal values are generally different from each other because of different levels of gain and bulk loss in the two wavelength regimes. Coatings that address both sets of wavelengths for front/back facet reflectivity with HR/anti-reflective (AR) or HR/PR, especially as the spectral bands are further apart, are complicated to design, may make the facets more susceptible to optical damage, and reduce the flexibility in optimizing the output for emission spectrum in either band. An alternative to HR/uncoated or HR/PR is to make at least the rear facet substantially low reflectivity, which may be considered to be anti-reflective (AR). This scheme would then place the burden of HR or PR coatings on external optics, which may be easier to coat, and easier to replace than the gain chip.

In FIG. 9, the TI-QCL chip 900 acts as the laser cavity of the semiconductor light-emitting device. As used herein, the term laser cavity is to mean a device that resonates an optical signal between two or more reflective components and includes a gain medium that amplifies photons that are generated and fed back.

Figure 11:
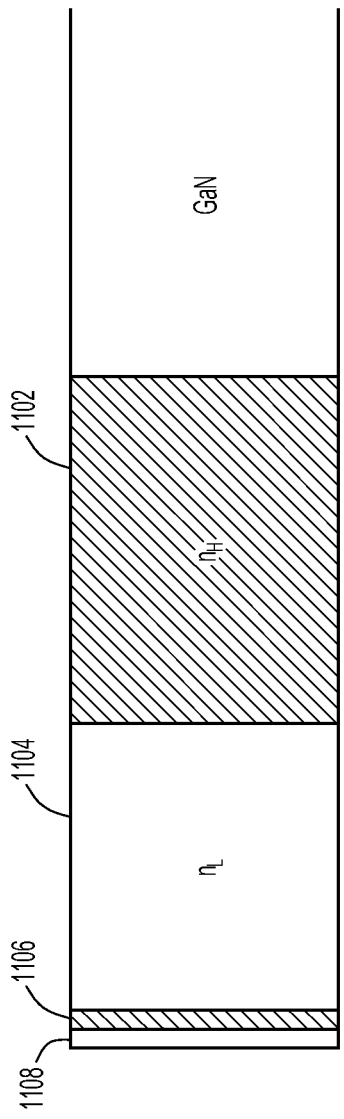
FIG. 11 illustrates a stack of layers for anti-reflective (AR) coatings on a substrate of a semiconductor light-emitting device according to an example embodiment, according to an example embodiment.

For a TI-QCL that emits both interband and intraband components in widely separated spectral bands, a stack of layers for AR coatings may be employed. As a result of material dispersion, a single layer AR coating may be less desirable, as such a layer typically does not work for both the interband and intraband components. FIG. 11 illustrates a stack of layers for AR coatings on a substrate of a semiconductor light-emitting device, according to an example embodiment. In the example shown in FIG. 11, the substrate is GaN. The stack includes a first layer 1102, a second layer 1104, a third layer 1106, and a fourth layer 1108. The first layer 1102 may be of thickness $\lambda_{intra}/4$ and of high index ($n_H$). The second layer 1104 may be of thickness $\lambda_{intra}/4$ and of low index a ($n_L$). These layers are followed by the third and fourth layers 1106, 1108, which have a thickness of $\lambda_{inter}/4$ and have the same indices. The first and second layers 1102, 1104 may be relatively thick layers, and the third and fourth layers 1106, 1108 may be relatively thin layers and thinner than the first and second layers 1102, 1104.

Figure 12:
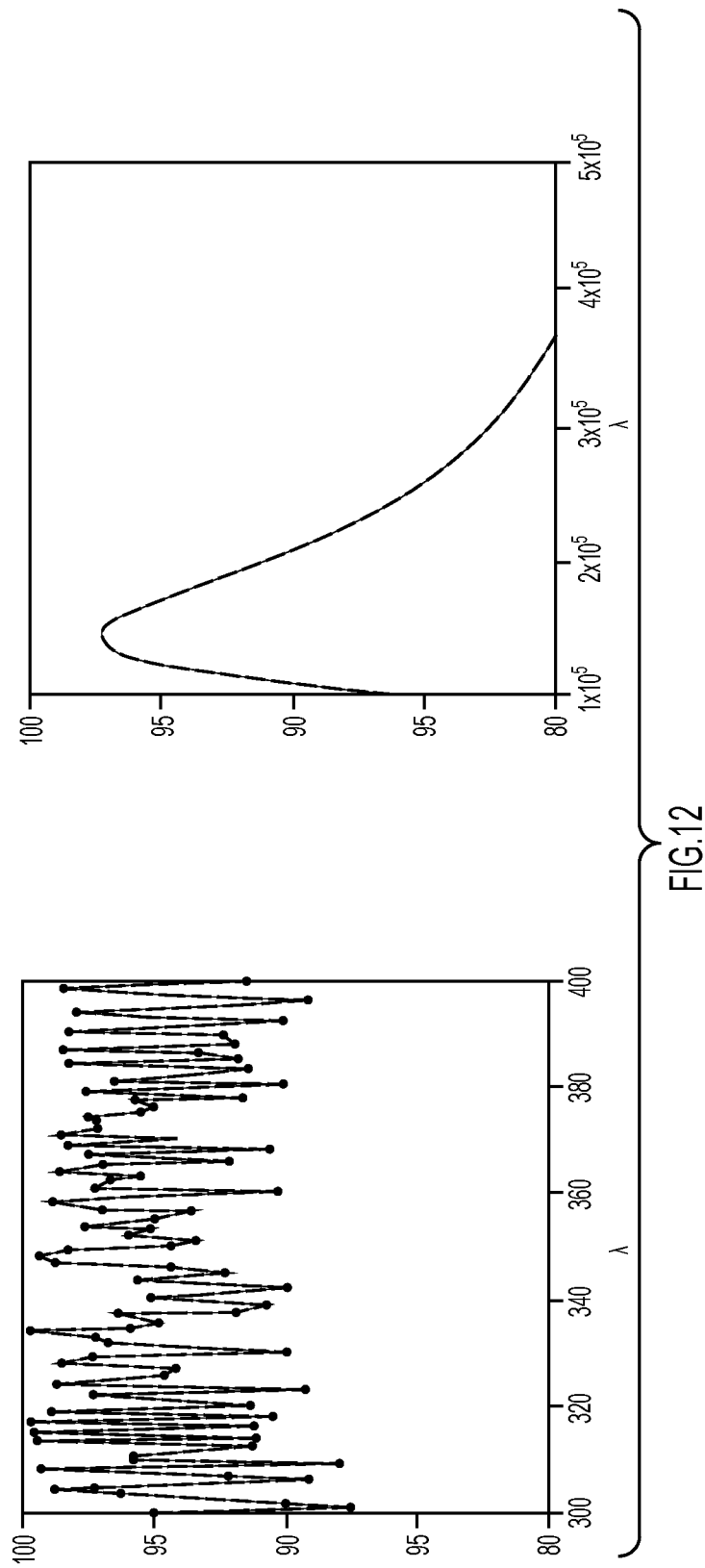
FIG. 12 illustrates plots of calculated transmission spectra in the $\lambda_{inter}$ (left plot) and $\lambda_{intra}$ (right plot) for coating stack based on quarter-wave layers of $SiO_2$ and $Al_2O_3$ for a semiconductor light-emitting device according to an example embodiment.

Two example coating materials are $SiO_2$ and $Al_2O_3$, for low and high indices, respectively, which have relatively low absorption in the UV and THz regions, and therefore extinction coefficients of κ=0 are assumed for each material in each wavelength range in calculating the transmission in each spectral band. The refractive indices of GaN and these coating materials are listed in the table of FIG. 10, and FIG. 12 shows calculated transmission spectra in the $\lambda_{inter}$ and $\lambda_{intra}$ regions for a coating stack based on quarter-wave layers of $SiO_2$ and $Al_2O_3$. Dispersion was ignored within the given spectral region of the plots, and the design wavelengths were 0.36 and 140 μm for UV and THz, respectively. The transmission in the UV where commercial GaN laser diodes exhibit the best performance (e.g., laser diodes available from Nichia Corporation)—i.e, ~0.395 μm—is seen to be between 86 and 96%, depending on the central wavelength and spectral linewidth. In the THz region, the transmission peaks at 96% at the design wavelength, which corresponds to 2 THz. In each case, however, the peak can be shifted and broadened according to refinements of layer thicknesses and choice of film materials.

Figure 13:
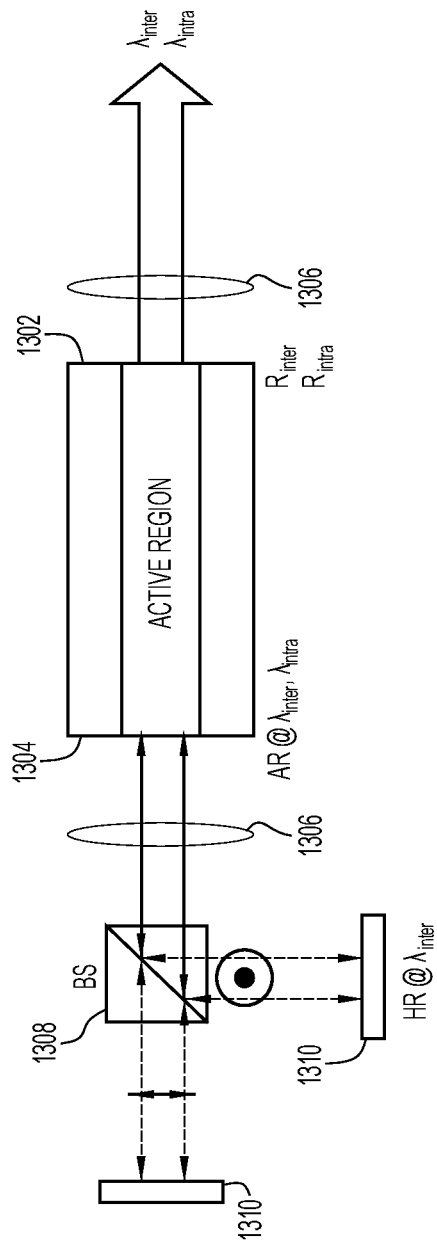
FIG. 13 is a schematic diagram of a laser cavity with external optics for a semiconductor light-emitting device according to an example embodiment.

FIG. 13 is a schematic diagram of a laser cavity with external optics for a semiconductor light-emitting device according to an example embodiment. In the example shown in FIG. 13, the TI-QCL chip has an uncoated front facet 1302, an AR-coated rear facet 1304, collimation lenses 1306, a beam splitter (beam splitting element) 1308, and mirrors 1310, according to an example embodiment. The beam splitter 1308 may be, for example, a dichroic beam splitter (BS) or a polarization beam splitting cube, which reflects $\lambda_{inter}$ and transmits $\lambda_{intra}$. Emission from the rear facet 1304 can be separated by the beam splitter 1308. The polarization beam splitting cube takes advantage of the polarization difference between the two components. In this example, the BS 1308 (dichroic or polarizing beam splitter) is employed to partition the interband and intraband emission components, which may be widely separated in wavelength and orthogonally polarized, to their associated high reflectors. In QCLs, the intraband wave is TM-polarized due to intersubband selection rules, whereas the interband component is TE-polarized. The double-headed arrow perpendicular to the intraband beam (dotted line) propagation direction is the (TM) polarization direction, and the encircled dot in the interband (dashed line) path denotes its (TE) polarization direction out of the page. The solid lines/arrows to the right of the BS represent the common path of the two components, the presence of which depends on the bias generated by the waveband controller. The mirrors 1310 may be highly reflecting free space mirrors. Directing the beams to two different highly reflecting free space mirrors, optimized for each band, alleviates the need for designing and depositing a dual-band highly reflective coating on the chip.

In an example, the front and rear facets 1302, 1304 are cleaved and at least the rear facet 1304 is AR-coated with a quarter-wave stack of layers to support an external optical cavity with a common minimally dispersive collimation optic and output coupler resonating at least one of ultraviolet (UV) radiation or visible light wavelengths, and the second wavelength band includes at least one of mid-wave infrared (MWIR) radiation or terahertz (THz) radiation wavelengths.

Figure 14:
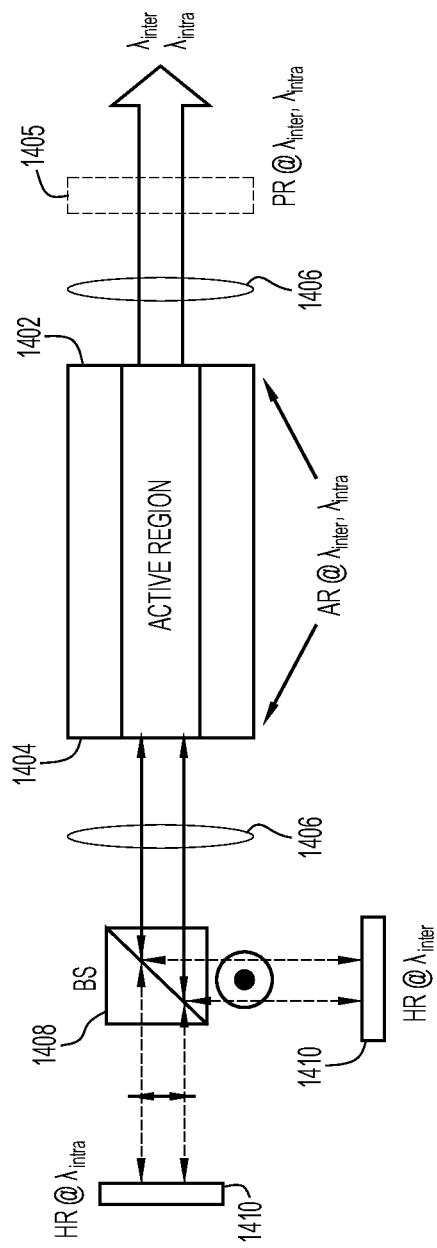
FIG. 14 is a schematic diagram of a laser cavity with external optics for the front and rear reflectors of a semiconductor light-emitting device according to an example embodiment.

FIG. 14 is a schematic diagram of a laser cavity with external optics for a semiconductor light-emitting device, according to an example embodiment. In the example shown in FIG. 14, the laser cavity is shown with both facets 1402 and 1404 AR-coated. A PR free space mirror may be utilized to optimize the output in both bands, rather than relying on the fixed Fresnel reflectivities of an uncoated front facet. A single PR output coupler 1405 is located following the front facet collimating lens 1406. The optics following the rear facet (lens 1406, BS 1408, and mirrors 1410) may be the same as those described above with respect to FIG. 13.

Figure 15:
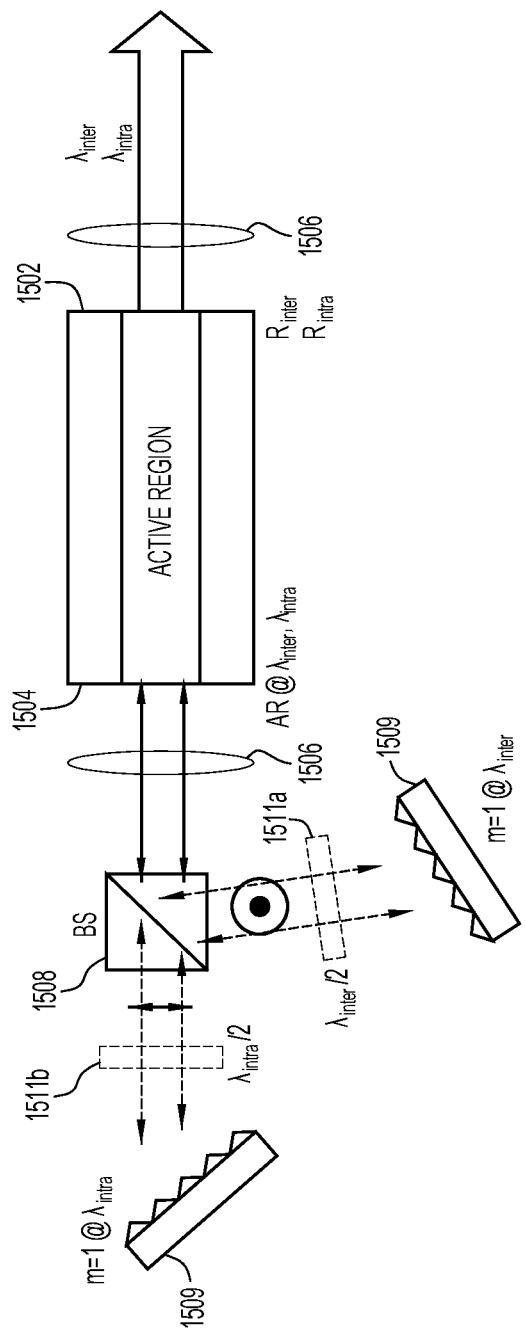
FIG. 15 is a schematic diagram of a laser cavity with external optics including gratings for a semiconductor light-emitting device according to an example embodiment.

FIG. 15 is a schematic diagram of a laser cavity with external optics for a semiconductor light-emitting device according to an example embodiment. The laser cavity shown in FIG. 15 is similar to the laser cavity described with respect to FIG. 13, except the mirrors 1310 have been replaced with gratings 1509. Because the cavity spectral bandwidth of a Fabry-Perot QCL is typically quite broad (e.g., up to ~150 nm), a QCL beam can experience high loss upon propagation through atmosphere in spectral regions densely populated by molecular absorption lines. A solution for obtaining high output power in a narrow spectral line is to use diffraction gratings, as shown in FIG. 15 (e.g., instead of the HR mirrors as shown in FIG. 13), which depicts the resonated beam as the first order (m=1) diffracted beam. In this case the grating efficiency is maximized by including in each path a half-wave ($\lambda/2$) plate for rotating the linear polarization of each beam. The gratings are shown with jagged surfaces that represent blazing. The gratings may diffract the first order (m=1) beam back through the active medium. The $\lambda/2$ optics 1511a, 1511b are half-wave plates for independently optimizing the two orthogonally polarized spectral components.

Figure 16:
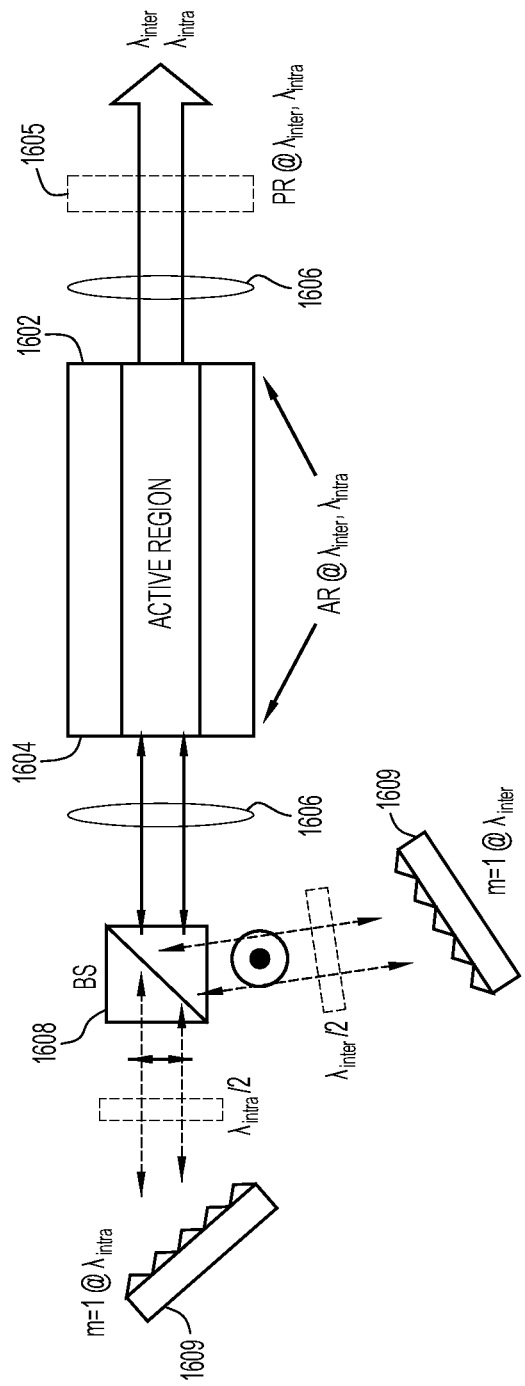
FIG. 16 is a schematic diagram of a laser cavity with external optics for achieving narrow spectral lines for a semiconductor light-emitting device according to an example embodiment.

FIG. 16 is a schematic diagram of a laser cavity with external optics for a semiconductor light-emitting device according to an example embodiment. The laser cavity shown in FIG. 16 is similar to the laser cavity described with respect to FIG. 14, except the mirrors 1410 have been replaced with gratings 1609. Facets 1602, 1604 are both AR-coated so that a PR free space mirror can be utilized to optimize the output in both bands, e.g., rather than relying on the fixed Fresnel reflectivities of the uncoated front facet. This configuration may deliver maximum spectral brightness relative to the others presented above.

Figure 17:
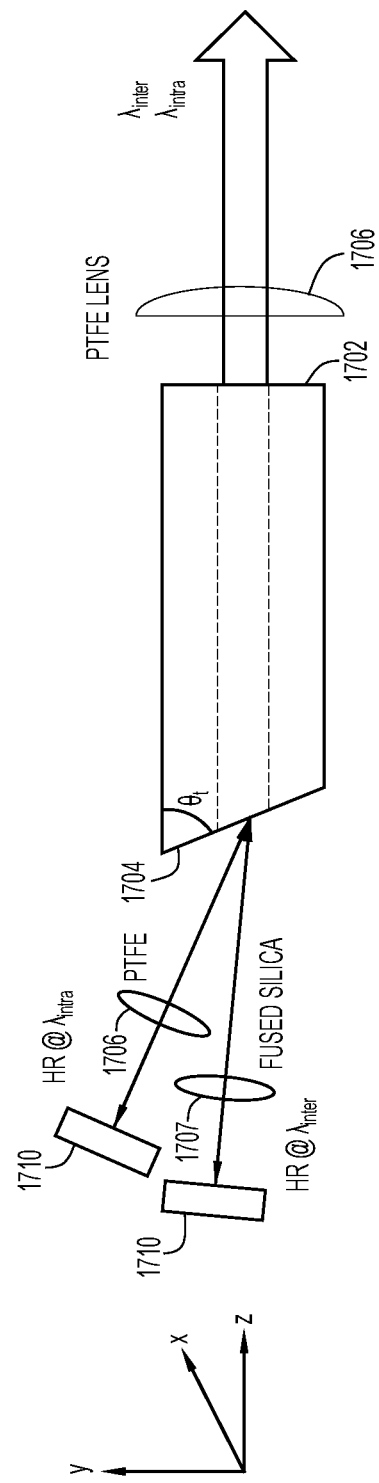
FIG. 17 is a schematic diagram of a laser cavity with external optics for a semiconductor light-emitting device employing a tilted rear facet according to an example embodiment.

FIG. 17 is a schematic diagram of a laser cavity with external optics, according to an example embodiment. The laser cavity may include a GaN TI-QCL, which is AR-coated on the front facet for both spectral bands and either AR-coated on the rear facet, and/or fabricated with a tilted facet (angle $\theta_t$) there to reduce reflectivity. External optics are employed for high reflection. The view shown in FIG. 17 is within the y-z plane of the chip (plane of growth direction). Dashed lines represent the boundary containing the core of the waveguide.

The example embodiment shown in FIG. 17 may be an alternative to the use of a beam splitter, and may be a method for further reducing the reflectivity of the rear facet and improving laser performance. As shown, the facet is modified to have a tilt angle $\theta_t$. The tilt angle $\theta_t$ may be, for example, greater than 0 degrees and less than or equal to 22 degrees. It is to be understood that the tilt angle $\theta_t$ may be other values and/or may be selected based on, for example, a type and/or size of external optics, a cavity length, an aperture size, and/or a mirror size, among other considerations or factors. The tilt direction can be either in the growth direction (y-z plane) or perpendicular to the growth direction (x-z plane). If the tilt is in the y-z plane, then tilting the facet away from the substrate, as in FIG. 17, tends to improve performance since it mitigates interaction with the substrate, which can absorb a substantial fraction of the light. Tilted front facets may be formed by focused ion beam (FIB) milling in the x-z plane with InGaAs/InAlAs QCLs emitting at 8 µm. As the tilt angle increases, the modal reflectivity, calculated to be well below 0.01 at the largest angle 22 degrees, decreases, leading to an increase in threshold current density due to the associated reduction in cavity Q. However, at the same time the slope efficiency increases and the spectral linewidth narrows.

The tilted facet also takes advantage of chromatic dispersion, such that the interband and intraband components can be directed toward different sets of optics by virtue of different refractive angles and Snell's law. For GaN, for example, the index of refraction n may be 2.5 in the UV (360 nm) and 3.1 at 1 THz (see FIG. 10). The lenses in each path, employed to collimate the widely diverging emission from the chip, could be AR-coated fused silica for $\lambda_{inter}$, and GaAs or PTFE for $\lambda_{intra}$. An advantage of PTFE is that it has low absorption and flat dispersion over a huge range spanning the UV to THz regions, so similar PTFE lenses could potentially be used in both paths. After passing through the lenses, the separated beams can be highly reflected in those respective bands by mirrors coated with UV-enhanced aluminum or gold, e.g., as available from Thorlabs or Tydex. As an alternative and/or additional example, gratings could be used (e.g., instead of mirrors) to feed back a high order diffracted beam into the chip to produce spectrally narrow lines used for high resolution spectroscopy.

In principle, the TM wave reflectivity could be reduced to zero at the Brewster angle (about 17° for THz in GaN), but it has been found that the tilt angle required to accomplish this—at least for a MWIR QCL—would require an active region that would be unrealistically thick. Stimulated emission was demonstrated from a GaAs THz QCL that included an uncoated tilted facet on one end of the chip at an angle slightly smaller than the nominal Brewster angle (value calculated assuming plane wave propagation). In reality, the beam propagates in a zig-zag path through the waveguide core (active region in FIG. 1), and therefore is incident on the facets—even without tilt in them—at some non-normal angle that depends on the wavelength, waveguide core thickness, and refractive index. Beyond Brewster's angle, reflectivity increases to 1 at the critical angle $\theta_c$ (~18° for THz in GaN) for total internal reflection (TIR) at the rear facet. If this could be achieved for the intraband component it would allow that facet to naturally become a high reflector while still allowing the interband one to pass through the facet, given that the AR coating for the latter would support such an angle. In this case the scheme in FIG. 17 could be further simplified since no external optics would be required for the intraband component on the rear facet side.

Figure 18:
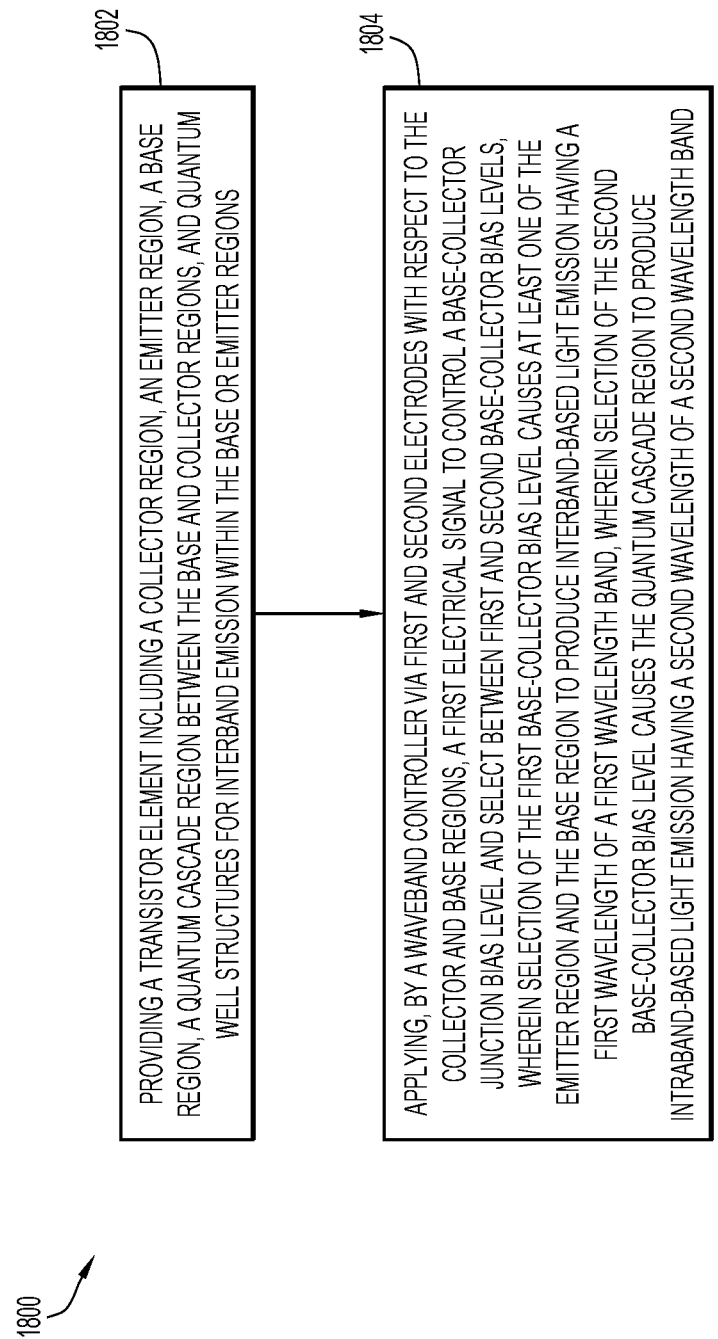
FIG. 18 is a flowchart of a method for generating stimulated light emission in multiple wavebands through a single aperture, according to an example embodiment.

FIG. 18 is a flowchart of a method 1800 for generating light emission, according to an example embodiment. The method 1800 may be employed for generating stimulated light emission in multiple wavebands through a single aperture. A semiconductor light emitting device (e.g., semiconductor light emitting device 100 of FIG. 1) may be employed in performing the method 1800. At 1802, a transistor element is provided that includes a collector region, an emitter region, a base region, a quantum cascade region between the base and collector regions, and quantum well structures for interband emission within the base or emitter regions. The base region or emitter region may include single or multiple quantum wells for enhancing stimulated emission.

In an example embodiment, the quantum cascade region may include a well region including gallium nitride (GaN) and a barrier region including aluminum gallium nitride (AlGaN).

At 1804, a waveband controller applies, via first and second electrodes with respect to the collector and base regions, a first electrical signal to control a base-collector junction bias level and select between first and second base-collector bias levels. Selection of the first base-collector bias level causes at least one of the emitter region and the base region to produce interband-based light emission having a first wavelength of a first wavelength band. Selection of the second base-collector bias level causes the quantum cascade region to produce intraband-based light emission having a second wavelength band. For example, the first wavelength band may include at least one of UV radiation or visible light wavelengths, and the second wavelength band may include at least one of MWIR radiation or THz radiation wavelengths. In an example embodiment, the first electrode may be coupled to the collector region, the second electrode may be coupled to the base region, and the third electrode may be coupled to the emitter region.

In an example embodiment, the method may further include applying, by a modulator via the second and third electrodes with respect to the base and emitter regions, a second electrical signal to modulate an optical power, pulse width, pulse repetition frequency, and/or pulse shape of at least one of the intraband-based light emission from the quantum cascade region and the interband-based light emission from the least one of the emitter region and the base region.

In an example embodiment, the method may further include emitting intraband-based light emission and interband-based light-emission from a single aperture.

In an example embodiment, the method may further include switching from producing interband-based light emission to producing intraband-based light emission by adjusting the first electrical signal to select the first base-collector bias level.

In an example embodiment, the method may further include switching from producing intraband-based light emission to producing interband-based light emission by adjusting the first electrical signal to select the second base-collector bias level.

In an example embodiment, the method may further include emitting at least of one of the intraband-based light emission having the first wavelength and the interband-based light emission having the second wavelength, and maintaining the emission at the respective wavelength by adjusting the first electrical signal based on temperature sensor feedback.

In an example embodiment, the method may further include providing cleaved facets and an external optical cavity for generating high power stimulated emission, spectral line narrowing, and emission through a single aperture.

In an example embodiment, the method may further include providing cleaved facets on the transistor element with at least the rear facet AR-coated with a quarter-wave stack of layers to support an external optical cavity with a common minimally dispersive collimation optic and output coupler resonating at least one of ultraviolet (UV) radiation or visible light wavelengths, and the second wavelength band includes at least one of mid-wave infrared (MWIR) radiation or terahertz (THz) radiation wavelengths.

In an example embodiment, the method may further include directing interband-based light to a first reflector and intraband-based light to a second reflector. The directing may include partitioning light using a beam splitter.

In an example embodiment, the method may further include providing external cavity optics including dichroic or polarizing beam splitters to partition interband and intraband emission components, which are widely separated in wavelength and orthogonally polarized, to respective high reflectors.

In an example embodiment, the transistor element may comprise a multi-layer stack of antireflective coatings on the transistor element, wherein at least a first one of the layers of the multi-layer stack has a thickness corresponding to the first wavelength and at least a second one of the layers has a thickness corresponding to the second wavelength In an example embodiment, the method may further include providing high reflectors in a rear portion of the external cavity comprising gratings that are blazed for a high efficiency diffraction order ($m \geq 1$) to produce narrow spectral lines in the interband and intraband spectral regions.

In an example embodiment, the method further includes providing a tilted rear facet that partitions the intraband and interband emission components to their associated high reflectors.

It will be appreciated that the example embodiments described above and illustrated in the drawings represent only a few of the many ways of implementing the invention. Many modifications and variations will be apparent to those of ordinary skill in the art without departing from the scope and spirit of the invention.

What is claimed is:

1. A method for generating light emission, the method comprising:
   providing a transistor element including a collector region, an emitter region, a base region, a quantum cascade region between the base and collector regions, and quantum well structures within the emitter region, wherein the quantum well structures of the emitter region are configured to produce interband-based light emission in a first wavelength band that includes ultraviolet (UV) radiation wavelengths, and the quantum cascade region is configured to produce intraband-based light emission in a second wavelength band that includes one or more from a group of infrared (IR) radiation wavelengths and terahertz (THz) radiation wavelengths;
   applying, by a waveband controller via first and second electrodes with respect to the collector and base regions, a first electrical signal to control a base-collector junction bias level and select between first and second base-collector bias levels, wherein selection of the first base-collector bias level causes the emitter region to produce the interband-based light emission having a first wavelength of the first wavelength band, wherein selection of the second base-collector bias level causes the quantum cascade region to produce the intraband-based light emission having a second wavelength of the second wavelength band; and
   applying, by a modulator via the second electrode and a third electrode with respect to the base and emitter regions, a second electrical signal to independently modulate pulse characteristics of the intraband-based light emission and the interband-based light emission produced based on the first electrical signal.

2. The method of claim 1, wherein the pulse characteristics include an optical power, pulse width, pulse repetition frequency, and/or pulse shape.

3. The method of claim 1, wherein the quantum cascade region includes a well region comprising gallium nitride (GaN) and a barrier region comprising aluminum gallium nitride (AlGaN).

4. The method of claim 1, further comprising emitting intraband-based light emission and interband-based light-emission from a single aperture.

5. The method of claim 1, further comprising switching from producing interband-based light emission to producing intraband-based light emission by adjusting the first electrical signal to select the second base-collector bias level.

6. The method of claim 1, further comprising switching from producing intraband-based light emission to producing interband-based light emission by adjusting the first electrical signal to select the first base-collector bias level.

7. The method of claim 1, further comprising:
emitting at least of one of the intraband-based light emission having the second wavelength and the interband-based light emission having the first wavelength; and
maintaining the emission at the respective wavelength by adjusting the first electrical signal based on temperature sensor feedback.

8. The method of claim 1, further comprising directing interband-based light to a first reflector and intraband-based light to a second reflector.

9. The method of claim 1, wherein the transistor element comprises a multi-layer stack of antireflective coatings, wherein first and second adjacent layers of the multi-layer stack have a thickness corresponding to the second wavelength and third and fourth adjacent layers of the multi-layer stack have a thickness corresponding to the first wavelength, and wherein the first and third layers include a material with a first refractive index and the second and fourth layers include a material with a second refractive index less than the first refractive index.

10. A semiconductor light-emitting device, comprising:
a transistor element including a collector region, an emitter region, and a base region;
a first electrode coupled to the collector region, a second electrode coupled to the base region, and a third electrode coupled to the emitter region;
a quantum cascade region disposed between the base and collector regions of the transistor element and quantum well structures disposed within the emitter region, wherein the quantum well structures of the emitter region are configured to produce interband-based light emission in a first wavelength band that includes ultraviolet (UV) radiation wavelengths, and the quantum cascade region is configured to produce intraband-based light emission in a second wavelength band that includes one or more from a group of infrared radiation (IR) wavelengths and terahertz (THz) radiation wavelengths;
a waveband controller connected to the first and second electrodes and configured to apply a first electrical signal via the first and second electrodes with respect to the collector and base regions to control a base-collector junction bias level and select between first and second base-collector bias levels, wherein selection of the first base-collector bias level causes the emitter region to produce the interband-based light emission having a first wavelength of the first wavelength band, wherein selection of the second base-collector bias level causes the quantum cascade region to produce the intraband-based light emission having a second wavelength of the second wavelength band; and
a modulator connected to the second and third electrodes and configured to apply a second electrical signal via the second and third electrodes with respect to the base and emitter regions to independently modulate pulse characteristics of the intraband-based light emission and the interband-based light emission produced based on the first electrical signal.

11. The semiconductor light-emitting device of claim 10, wherein the pulse characteristics include an optical power, pulse width, pulse repetition frequency, and/or pulse shape.

12. The semiconductor light-emitting device of claim 10, wherein the quantum cascade region includes a well region comprising gallium nitride (GaN) and a barrier region comprising aluminum gallium nitride (AlGaN).

13. The semiconductor light-emitting device of claim 10, further comprising an emission aperture, wherein each of the intraband-based light emission and the interband-based light emission is emitted from the emission aperture.

14. The semiconductor light-emitting device of claim 10, wherein the waveband controller comprises a microcontroller and power converter circuitry, the microcontroller communicatively coupled to the power converter circuitry to control the base-collector junction bias level.

15. The semiconductor light-emitting device of claim 10, wherein the waveband controller is configured to adjust the first electrical signal from the first base-collector bias level to the second base-collector bias level to switch from emission of the interband-based light emission having the first wavelength to the intraband-based light emission having the second wavelength.

16. The semiconductor light-emitting device of claim 10, wherein the waveband controller is configured to adjust the first electrical signal from the second base-collector bias level to the first base-collector bias level to switch emission from the intraband-based light emission having the second wavelength to the interband-based light emission having the first wavelength.

17. The semiconductor light-emitting device of claim 10, further comprising a temperature sensor configured to collect semiconductor light-emitting device temperature data, wherein the waveband controller is configured to adjust the first electrical signal based on the semiconductor light-emitting device temperature data to maintain emission of at least one of the intraband-based light emission having the second wavelength and the interband-based light emission having the first wavelength at the respective wavelength.

18. The semiconductor light-emitting device of claim 10, further comprising a multi-layer stack of antireflective coatings on the transistor element, wherein and second adjacent layers of the multi-layer stack have a thickness corresponding to the second wavelength and third and fourth adjacent layers of the multi-layer stack have a thickness corresponding to the first wavelength, and wherein the first and third layers include a material with a first refractive index and the second and fourth layers include a material with a second refractive index less than the first refractive index.

19. A method for generating light emission, the method comprising:
providing a transistor element including a collector region, an emitter region, a base region, a quantum cascade region between the base and collector regions, and quantum well structures within the base or emitter regions, wherein the quantum well structures are configured to produce interband-based light emission in a first wavelength band that includes ultraviolet (UV) radiation wavelengths, and the quantum cascade region is configured to produce intraband-based light emission in a second wavelength band that includes one or more from a group of infrared (IR) radiation wavelengths and terahertz (THz) radiation wavelengths;

applying, by a waveband controller via first and second electrodes with respect to the collector and base regions, a first electrical signal to control a base-collector junction bias level and select between first and second base-collector bias levels, wherein selection of the first base-collector bias level causes at least one of the emitter region and the base region to produce the interband-based light emission having a first wavelength of the first wavelength band, wherein selection of the second base-collector bias level causes the quantum cascade region to produce the intraband-based light emission having a second wavelength of the second wavelength band; and applying, by a modulator via the second electrode and a third electrode with respect to the base and emitter regions, a second electrical signal to independently modulate pulse characteristics of the intraband-based light emission and the interband-based light emission produced based on the first electrical signal;

wherein the transistor element comprises a multi-layer stack of antireflective coatings, wherein first and second adjacent layers of the multi-layer stack have a thickness corresponding to the second wavelength and third and fourth adjacent layers of the multi-layer stack have a thickness corresponding to the first wavelength, and wherein the first and third layers include a material with a first refractive index and the second and fourth layers include a material with a second refractive index less than the first refractive index.

* * * * *